(12) United States Patent
Toba et al.

(10) Patent No.: US 8,878,189 B2
(45) Date of Patent: Nov. 4, 2014

(54) GROUP III NITRIDE SEMICONDUCTOR GROWTH SUBSTRATE, GROUP III NITRIDE SEMICONDUCTOR EPITAXIAL SUBSTRATE, GROUP III NITRIDE SEMICONDUCTOR ELEMENT AND GROUP III NITRIDE SEMICONDUCTOR FREE-STANDING SUBSTRATE, AND METHOD OF PRODUCING THE SAME

(75) Inventors: Ryuichi Toba, Chiyoda-ku (JP);
Masahito Miyashita, Chiyoda-ku (JP);
Tatsunori Toyota, Chiyoda-ku (JP);
Yoshitaka Kadowaki, Chiyoda-ku (JP)

(73) Assignees: Dowa Holdings Co., Ltd., Tokyo (JP);
Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/259,788

(22) PCT Filed: Mar. 25, 2010

(86) PCT No.: PCT/JP2010/055986
§ 371 (c)(1),
(2), (4) Date: Sep. 29, 2011

(87) PCT Pub. No.: WO2010/110489
PCT Pub. Date: Sep. 30, 2010

(65) Prior Publication Data
US 2012/0061683 A1   Mar. 15, 2012

(30) Foreign Application Priority Data

Mar. 27, 2009 (JP) .................. 2009-080242
Mar. 25, 2010 (JP) .................. 2010-069413

(51) Int. Cl.
*H01L 29/15* (2006.01)
*H01L 21/02* (2006.01)

(52) U.S. Cl.
CPC .... *H01L 21/02365* (2013.01); *H01L 21/02505* (2013.01); *H01L 21/0237* (2013.01); *H01L*

(Continued)

(58) Field of Classification Search
CPC .............. H01L 21/02631; H01L 21/02554;
H01L 21/02164; H01L 21/02367; H01L
21/02518; H01L 21/02581; H01L 21/0237;
H01L 21/02439; H01L 21/02548; H01L
21/02365; H01L 21/02505; H01L 21/0254;
H01L 21/026
USPC ............ 257/77, 89, 13, 613, 192; 438/22, 46,
438/604, 72
See application file for complete search history.

(56) References Cited

U.S. PATENT DOCUMENTS 6,045,626 A * 4/2000 Yano et al. ................. 148/33.4

(Continued)

FOREIGN PATENT DOCUMENTS

CN            101378015 A      3/2009

(Continued)

OTHER PUBLICATIONS

International Search Report issued in Application No. PCT/JP2010/055986; Dated Jul. 6, 2010 (With Translation).

(Continued)

*Primary Examiner* — Fernando L Toledo
*Assistant Examiner* — Mohammed Shamsuzzaman
(74) *Attorney, Agent, or Firm* — Oliff PLC (57) ABSTRACT

An object of the present invention is to provide a Group III nitride semiconductor epitaxial substrate, a Group III nitride semiconductor element, and a Group III nitride semiconductor free-standing substrate, which have good crystallinity, with not only AlGaN, GaN, and GaInN the growth temperature of which is 1050° C. or less, but also with $Al_xGa_{1-x}N$ having a high Al composition, the growth temperature of which is high; a Group III nitride semiconductor growth substrate used for producing these, and a method for efficiently producing those. The present invention provides a Group III nitride semiconductor growth substrate comprising a crystal growth substrate including a surface portion composed of a Group III nitride semiconductor which contains at least Al, and a scandium nitride film formed on the surface portion are provided.

8 Claims, 5 Drawing Sheets (52) U.S. Cl.
CPC ............... 21/0254 (2013.01); *H01L 21/02664* (2013.01); *H01L 21/02488* (2013.01); *H01L 21/02439* (2013.01); *H01L 21/02458* (2013.01)
USPC ............. 257/77; 257/89; 257/13; 257/613; 257/192; 438/22; 438/46; 438/604; 438/72

(56) References Cited

U.S. PATENT DOCUMENTS

| | | | |
|---|---|---|---|
| 6,468,347 B1* | 10/2002 | Motoki et al. | 117/89 |
| 7,189,588 B2* | 3/2007 | Usui et al. | 438/22 |
| 7,566,579 B2* | 7/2009 | Watson et al. | 438/46 |
| 8,216,869 B2 | 7/2012 | Yao et al. | |
| 2006/0046325 A1 | 3/2006 | Usui et al. | |
| 2007/0085093 A1* | 4/2007 | Ohmae et al. | 257/89 |
| 2007/0141823 A1* | 6/2007 | Preble et al. | 438/604 |
| 2007/0205407 A1* | 9/2007 | Matsuo et al. | 257/13 |
| 2008/0261378 A1 | 10/2008 | Yao et al. | |
| 2010/0009516 A1 | 1/2010 | Yao et al. | |

FOREIGN PATENT DOCUMENTS

| | | |
|---|---|---|
| GB | 2 398 672 A | 8/2004 |
| JP | A-2000-150875 | 5/2000 |
| JP | A-2003-178984 | 6/2003 |
| JP | A-2004-39810 | 2/2004 |
| JP | A-2005-119921 | 5/2005 |
| JP | A-2008-091728 | 4/2008 |
| JP | A-2008-091729 | 4/2008 |
| JP | A-2008-100860 | 5/2008 |
| JP | A-2009-54888 | 3/2009 |
| JP | A-2009-221083 | 10/2009 |
| WO | WO 2006/126330 A1 | 11/2006 |

OTHER PUBLICATIONS

Notice of Preliminary Rejection dated May 23, 2013 from Korean Patent Application No. 10-2011-7024798 (with English-language translation).

Moram et al.; "Very low dislocation density, resistive GaN films obtained using transition metal nitride interlayers;" *phys. stat. sol.* (a); 2008; pp. 1064-1066; vol. 205. No. 5.

Extended European Search Report dated Sep. 20, 2013 from European Patent Application No. 10756280.3.

Notification of Reasons for Refusal dated Feb. 4, 2014 from Japanese Patent Application No. 2010-191049 (with English-language translation).

Notification of First Office Action dated Jun. 4, 2014 from Chinese Patent Application No. 201080021400.0 (with English-language translation).

European Office Action dated Jun. 23, 2014 from European Patent Application No. 10 756 280.3.

* cited by examiner

GROUP III NITRIDE SEMICONDUCTOR GROWTH SUBSTRATE, GROUP III NITRIDE SEMICONDUCTOR EPITAXIAL SUBSTRATE, GROUP III NITRIDE SEMICONDUCTOR ELEMENT AND GROUP III NITRIDE SEMICONDUCTOR FREE-STANDING SUBSTRATE, AND METHOD OF PRODUCING THE SAME

TECHNICAL FIELD

The present invention relates to a Group III nitride semiconductor growth substrate, a Group III nitride semiconductor epitaxial substrate, a Group III nitride semiconductor element, and a Group III nitride semiconductor free-standing substrate; and a method of producing the same.

RELATED ART

For example, Group III nitride semiconductor elements including a Group III nitride semiconductor typically made of a chemical compound of N and such as Al or Ga are widely used as light emitting elements or elements for electronic devices. Currently, the Group III nitride semiconductor is typically formed on a crystal growth substrate made of, for example, sapphire by MOCVD.

Nevertheless, since a Group III nitride semiconductor and a crystal growth substrate (typically of sapphire) have very different lattice constants, dislocation owing to the difference in the lattice constants would arise, which causes a problem in that the crystal quality of a Group III nitride semiconductor layer grown on a crystal growth substrate decreases.

To solve this problem, conventionally, a method has been widely used in which a GaN layer is grown on for example, a sapphire substrate with a low-temperature polycrystalline or amorphous buffer layer interposed therebetween. However, a sapphire substrate has low thermal conductivity and can not flow electric current because of its insulating properties. Therefore, a structure is adopted in which an n-electrode and a p-electrode are formed on one surface of a sapphire substrate to flow electric current. With such a structure, high electric current hardly flows and little heat is dissipated, which are unsuitable for manufacturing a high power output light emitting diode (LED).

In view of this, a method such as a laser lift-off method is applied. The method uses a configuration in which such an element is transferred and attached to an additional support substrate which has sufficient electrically conductivity and thermal conductivity, and electric current can flow in a vertical direction. The GaN layer formed on the sapphire substrate is irradiated with laser light having higher quantum energy than the energy gap of GaN to thermally decompose GaN into Ga and nitrogen, so that the Group III nitride semiconductor layer is separated from the sapphire substrate.

Further, as another conventional technology, WO 2006/126330, JP 2008-91728, and JP 2008-91729 disclose technique of growing a GaN layer on a sapphire substrate with a metal nitride layer interposed therebetween. According to this method, the dislocation density of a GaN layer can be reduced compared with the above technique, and a high quality GaN layer can be grown. This is because the differences in the lattice constants and thermal expansion coefficients between a metal nitride layer such as a CrN layer and a GaN layer are relatively small. Further, this CrN layer can be selectively etched with a chemical etchant, which is useful in a process using a chemical lift-off method.

However, in a nitride semiconductor element for generating light of a region of shorter wavelength than blue (for example, the wavelength of 400 nm or less), as the wavelength of light to be generated is shorter, the Al component x in an $Al_xGa_{1-x}N$ layer of the nitride semiconductor element is required to be higher. The growth temperature of $Al_xGa_{1-x}N$ having an Al composition of more than approximately 30 at. % is more than about 1050° C. that is a melting point of CrN. Therefore, when a Group III nitride semiconductor layer containing $Al_xGa_{1-x}N$ of which Al composition exceeds approximately 30 at. % is grown on a CrN layer, CrN melts under a high temperature environment, and it becomes difficult to remove CrN by chemical etching due to maldistribution of melting CrN or the like; thus, chemical lift-off is difficult. This shows that when a chemical lift-off method is adopted, a CrN layer can be used only when the Al composition x in the $Al_xGa_{1-x}N$ layer of the nitride semiconductor element is approximately 0.3 or less, and the light emitting element to be manufactured has wavelength limits. Therefore, when a chemical lift-off method is adopted in a device formation process, CrN can not be used as a buffer layer for growing $Al_xGa_{1-x}N$ having a high Al composition, the growth temperature of which is high. Accordingly, a material has been desired which can be easily removed by chemical etching even after heat treatment at a high temperature exceeding 1050° C. and is suitable for a chemical lift-off method.

Although a use of a metal having a high melting point instead of CrN may be considered, a highly corrosive hydrofluoric acid etchant is necessarily used to remove high melting point metals (such as Zr or Hf) by dissolution due to chemical etching. When the hydrofluoric acid etchant is used in chemical lift-off, since it is so corrosive to a substrate, an electrode, or the like that protection means are required, which is considered to lead to increase in the manufacturing cost accordingly and reduction in the degrees of freedom in a production process.

SUMMARY OF THE INVENTION

Problems to be Solved by the Invention

An object of the present invention is to solve the above described problems by providing a Group III nitride semiconductor epitaxial substrate, a Group III nitride semiconductor element, and a Group III nitride semiconductor free-standing substrate, which have good crystallinity, which can be used in chemical lift-off in a device production process using $Al_xGa_{1-x}N$ having a high Al composition, the growth temperature of which is high, as well as AlGaN, GaN, and GaInN, the growth temperature of which is 1050° C. or less; and a Group III nitride semiconductor growth substrate used for producing these. Another object of the present invention is to provide a method for efficiently producing those.

Means for Solving the Problems

To achieve the aforementioned object, the present invention primarily includes the following components.

(1) A Group III nitride semiconductor growth substrate comprising: a crystal growth substrate including a surface portion composed of a Group III nitride semiconductor which contains at least Al, and a scandium nitride film formed on the surface portion.

(2) The Group III nitride semiconductor growth substrate according to (1) above, wherein the scandium nitride film has a crystal orientation of the {111} plane.

(3) The Group III nitride semiconductor growth substrate according to (1) or (2) above, wherein a surface of the Group III nitride semiconductor has a crystal orientation of the {0001} plane.

(4) The Group III nitride semiconductor growth substrate according to any one of (1) to (3) above, further comprising an initial growth layer composed of at least one layer of a buffer layer made of $Al_xGa_{1-x}N$ ($0 \le x \le 1$) on the scandium nitride film.

(5) The Group III nitride semiconductor growth substrate according to any one of (1) to (4) above, wherein a thickness of the scandium nitride film is 3 nm to 100 nm.

(6) The Group III nitride semiconductor growth substrate according to any one of (1) to (5) above, wherein a base substrate of the crystal growth substrate is selected from the group consisting of sapphire, Si, SiC, and GaN.

(7) The Group III nitride semiconductor growth substrate according to any one of (1) to (6) above, wherein the surface portion is made of AlN.

(8) The Group III nitride semiconductor growth substrate according to any one of (1) to (7) above, wherein the scandium nitride film has a plurality of microcrystal portions having a triangular pyramid shape, and the plurality of microcrystal portions are uniformly formed on the surface portion.

(9) A Group III nitride semiconductor epitaxial substrate comprising at least one layer of a Group III nitride semiconductor layer on the Group III nitride semiconductor growth substrate according to any one of (1) to (8) above.

(10) A Group III nitride semiconductor free-standing substrate produced using the Group III nitride semiconductor growth substrate according to any one of (1) to (8) above.

(11) A Group III nitride semiconductor element produced using the Group III nitride semiconductor growth substrate according to any one of (1) to (8) above.

(12) A method of producing a Group III nitride semiconductor growth substrate, comprising: a step of forming a metal layer made of a Sc material on a crystal growth substrate including a surface portion composed of a Group III nitride semiconductor which contains at least Al, and a step of performing a nitriding process by heating the metal layer in an ambient gas containing an ammonia gas, thereby forming a scandium nitride film.

(13) The method of producing a Group III nitride semiconductor growth substrate, according to (12) above, wherein the ambient gas containing the ammonia gas is a mixed gas further containing one or more selected from an inert gas and a hydrogen gas.

(14) The method of producing a Group III nitride semiconductor growth substrate, according to (12) or (13) above, wherein a highest temperature for heating the metal layer is in the range of 850° C. to 1300° C., and heating time at 850° C. or higher is 1 min to 120 min.

(15) The method of producing a Group III nitride semiconductor growth substrate, according to any one of (12) to (14) above, further comprising a step of forming an initial growth layer composed of at least one layer of a buffer layer made of $Al_xGa_{1-x}N$ ($0 \le x \le 1$) on the scandium nitride film after the step of the nitriding process.

(16) A method of producing a Group III nitride semiconductor element, comprising: a step of forming a metal layer made of a Sc material on a crystal growth substrate including a surface portion composed of a Group III nitride semiconductor which contains at least Al; a step of performing a nitriding process by heating the metal layer in an ambient gas containing an ammonia gas to form a scandium nitride film, thereby producing a Group III nitride semiconductor growth substrate; a step of epitaxially growing at least one layer of a Group III nitride semiconductor layer over the Group III nitride semiconductor growth substrate, thereby producing a Group III nitride semiconductor epitaxial substrate; a step of isolating the Group III nitride semiconductor layer into a plurality of elements; a step of forming a support substrate on the Group III nitride semiconductor layer side; and a step of separating the Group III nitride semiconductor layer from the crystal growth substrate by chemical lift-off by selectively etching the scandium nitride film, thereby obtaining a Group III nitride semiconductor element.

(17) The method of producing a Group III nitride semiconductor element, according to (16) above, wherein the Group III nitride semiconductor layer is grown at a highest temperature in the range of 900° C. to 1300° C. in the step of producing the Group III nitride semiconductor epitaxial substrate.

(18) The method of producing a Group III nitride semiconductor element, according to (16) or (17) above, further comprising a step of forming an initial growth layer composed of at least one layer of a buffer layer made of $Al_xGa_{1-x}N$ ($0 \le x \le 1$) on the scandium nitride film after performing the nitriding process.

(19) The method of producing a Group III nitride semiconductor element, according to (18) above, wherein the initial growth layer is composed of a first buffer layer and a second buffer layer grown on the first buffer layer, a growth temperature of the first buffer layer is in the range of 900° C. to 1260° C., a growth temperature of the second buffer layer is in the range of 1030° C. to 1300° C., and the growth temperature of the first buffer layer is equal to or lower than the growth temperature of the second buffer layer.

(20) A method of producing a Group III nitride semiconductor free-standing substrate, comprising: a step of forming a metal layer made of a Sc material on a crystal growth substrate including a surface portion composed of a Group III nitride semiconductor which contains at least Al; a step of performing a nitriding process by heating the metal layer in an ambient gas containing an ammonia gas to form a scandium nitride film, thereby producing a Group III nitride semiconductor growth substrate; a step of epitaxially growing at least one layer of a Group III nitride semiconductor layer over the Group III nitride semiconductor growth substrate; and a step of separating the Group III nitride semiconductor layer from the crystal growth substrate by chemical lift-off by selectively etching the scandium nitride film, thereby obtaining a Group III nitride semiconductor free-standing substrate.

(21) The method of producing a Group III nitride semiconductor free-standing substrate, according to (20) above, wherein the Group III nitride semiconductor layer is grown at a highest temperature in the range of 900° C. to 1300° C. in the step for producing the Group III nitride semiconductor epitaxial substrate.

Effect of the Invention

A Group III nitride semiconductor growth substrate of the present invention comprises a crystal growth substrate including a surface portion composed of a Group III nitride semiconductor which contains at least Al, and a scandium nitride film formed on the surface portion. Thus, without greatly reducing the crystallinity of a Group III nitride semiconductor layer $Al_xGa_yIn_{1-x-y}N$ ($0 \le x \le 1$, $0 \le y \le 1$, $0 \le x+y \le 1$) to be formed later, the Group III nitride semiconductor layer can be easily separated from the crystal growth substrate by chemical lift-off.

Further, in chemical lift-off, an acid solution is used as an etchant, which allows the Group III nitride semiconductor layer to be easily separated from the crystal growth substrate.

As the etchant, a hydrochloric acid aqueous solution, a nitric acid aqueous solution, a mixed acid of sulfuric acid and nitric acid, organic acid, or the like can be used, and an acid solution which dissolves only ScN without dissolving the materials of the support substrate or the electrode to be used is appropriately selected.

Furthermore, according to the present invention, the above Group III nitride semiconductor growth substrate is used, which allows the substrate to be removed by chemical lift-off. Besides, a Group III nitride semiconductor epitaxial substrate, a Group III nitride semiconductor element, and a Group III nitride semiconductor free-standing substrate, which have good crystallinity can be provided, which can cover all wavelengths (200 nm to 1.5 µm) covered by a Group III nitride semiconductor material which exceeds the wavelength limit of the case of using a CrN material, in other words, which can cover the growth temperature range of the whole composition range of $Al_xGa_yIn_{1-x-y}N$ ($0 \le x \le 1$, $0 \le y \le 1$, $0 \le x+y \le 1$) including from AlN grown at a high temperature of 1200° C. or more to InN grown at a temperature of about 500° C.

Moreover, according to the present invention, a step of forming a metal layer made of a Sc material on a crystal growth substrate a surface portion composed of a Group III nitride semiconductor which contains at least Al, and a step of performing a nitriding process to the metal layer are provided. Thus, a Group III nitride semiconductor growth substrate can be produced such that the Group III nitride semiconductor layer can be easily separated from the crystal growth substrate by chemical lift-off without greatly reducing the crystallinity of the Group III nitride semiconductor layer $Al_xGa_yIn_{1-x-y}N$ ($0 \le x \le 1$, $0 \le y \le 1$, $0 \le x+y \le 1$) to be formed later.

In addition, in accordance with the present invention, chemical lift-off is performed using the above Group III nitride semiconductor growth substrate. Thus, a Group III nitride semiconductor epitaxial substrate, a Group III nitride semiconductor element, and a Group III nitride semiconductor free-standing substrate, which have good crystallinity can be produced efficiently, which can cover all wavelengths (200 nm to 1.5 µm) covered by a Group III nitride semiconductor material which exceeds the wavelength limit of the case of using a CrN material.

BEST MODE FOR CARRYING OUT THE INVENTION

Figure 1:
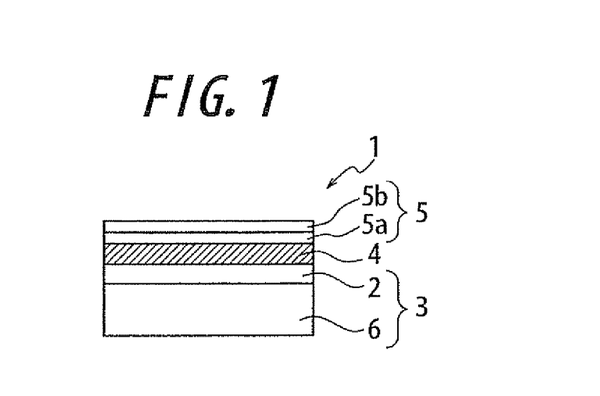
FIG. 1 is a schematic view illustrating a cross-sectional configuration of a nitride semiconductor growth substrate according to the present invention.

Next, an embodiment of a Group III nitride semiconductor growth substrate of the present invention will be described with reference to the drawings. Here, a Group III nitride semiconductor epitaxial substrate in the present invention refers to a substrate in which at least one layer of a Group III nitride semiconductor layer is grown on the Group III nitride semiconductor growth substrate. A Group III nitride semiconductor element refers to an element obtained by performing a device process such as vapor deposition for forming an electrode to the above Group III nitride semiconductor epitaxial substrate and an element isolated from the above Group III nitride semiconductor epitaxial substrate. Further, a Group III nitride semiconductor free-standing substrate refers to a substrate obtained by growing a Group III nitride semiconductor layer having a thickness of at least 50 µm or more on the above Group III nitride semiconductor growth substrate and then separating the Group III nitride semiconductor growth substrate. FIG. 1 schematically illustrates a cross-sectional configuration of a Group III nitride semiconductor growth substrate in accordance with this invention.

A Group III nitride semiconductor growth substrate 1 shown in FIG. 1 comprises a crystal growth substrate 3 including at least a surface portion 2 composed of a Group III nitride semiconductor which contains at least Al, and a nitride film 4 made of scandium nitride formed on the surface portion 2. With such a structure, without greatly reducing the crystallinity of a Group III nitride semiconductor layer to be formed over the scandium nitride film 4 later, the crystal growth substrate 3 can be separated from the Group III nitride semiconductor layer by chemical lift-off. Note that hatching in the figure is added for the sake of explanation.

The Group III nitride semiconductor growth substrate 1 preferably further includes an initial growth layer composed of at least one layer made of $Al_xGa_{1-x}N$ ($0 \le x \le 1$), especially in FIG. 1, an initial growth layer 5 composed of two layers of buffer layers 5a and 5b formed on the scandium nitride film 4. This improves the crystallinity of the nitride semiconductors layer to be grown thereon. The Al composition in these buffer layers can be selected as appropriate depending on the material to be formed thereon. Note that these buffer layers may contain a small amount of In.

The crystal growth substrate 3 may be a template substrate having the Group III nitride semiconductors 2 containing at least Al on a base substrate 6 made of a material used for growing a Group III nitride semiconductor such as sapphire, Si, SiC, GaN or AlGaN. Alternatively, the crystal growth substrate 3 may be a single crystal substrate of the Group III nitride semiconductors 2 or a surface nitrided sapphire substrate formed by nitriding a surface of sapphire. FIG. 1 illustrates the case where the crystal growth substrate 3 is an AlN template substrate having an AlN single crystal layer 2 on a sapphire substrate 6. This surface portion 2 made of Group III nitride semiconductor containing at least Al has an effect of reducing crystal defects in an AlGaN layer to be grown thereon.

At least the surface portion 2 of the crystal growth substrate 3 is preferably made of $Al_xGa_{1-x}N$ ($0.5 \le x \le 1$) having an Al composition of 50 at. % or more, more preferably of $Al_xGa_{1-x}N$ ($0.8 \le x \le 1$) having an Al composition of 80 at. % or more. When the Al composition of the crystal growth substrate 3 is as much as that of the Group III nitride semiconductor layer to be grown thereover, homoepitaxial growth occurs. This allows growth of a layer having good crystallinity with a low dislocation defect density. In addition, the surface portion 2 is most preferably made of AlN since when the Al composition of the crystal growth substrate 3 is higher than that of the Group III nitride semiconductor layer to be grown thereover, further effect of reducing dislocation can be expected because of compressive stress, and since the growth temperature of AlN is highest among the Group III nitride semiconductor materials, and besides it dose not deteriorate when the Group III nitride semiconductor layer is formed thereon.

The scandium nitride (ScN) film 4 can be obtained by nitriding a Sc metal film. A ScN material has excellent properties of having a high melting point and being able to be removed by dissolution using various kinds of acid solutions as an etchant. Further, a ScN crystal have a halite structure; however, when at least the surface portion 2 of the crystal growth substrate 3 is a Group III nitride semiconductor material containing Al, the ScN crystal is oriented to have the (111) plane with a 3-fold rotation axis which is the same as the crystal structure of the Group III nitride semiconductor containing Al, and the lattice constant and the coefficient of linear expansion along the a-axis of ScN approximate to those of the Group III nitride semiconductor containing Al. Unlike the case of using CrN, when ScN is directly formed on a sapphire substrate without the Group III nitride semiconductor material containing Al therebetween, the orientation degree of ScN decreases on account of the great difference in lattice constants between ScN and sapphire. Therefore, it is difficult to grow a high quality Group III nitride semiconductor layer thereon.

The scandium nitride film 4 preferably has a thickness of 3 nm to 100 nm. When the thickness is less than 3 nm, the scandium nitride film 4 is so thin that an etchant would be less likely to infiltrate, or the thickness of the metal Sc layer would be discontinuous due to nitriding, which would expose a surface of the crystal growth substrate as a ground substrate, so that the Group III nitride semiconductor layer would be directly grown on the crystal growth substrate. Such circumstances would make it difficult to perform chemical lift-off. On the other hand, when the thickness exceeds 100 nm, increase in the crystallinity due to the solid-state epitaxy of the scandium nitride film itself cannot be expected, which would reduce the crystallinity of the Group III nitride semiconductor layer thereon, and defects might increase. Further, this scandium nitride film 4 can be formed by forming a metal Sc layer on the crystal growth substrate 3 by a method such as sputtering or vacuum vapor deposition and then nitriding the metal Sc layer.

Although not shown in FIG. 1, at least one layer of a Group III nitride semiconductor layer is provided on the Group III nitride semiconductor growth substrate 1 having the above-described structure; thus, a Group III nitride semiconductor epitaxial substrate in accordance with the present invention can be obtained.

Similarly, although not shown in FIG. 1, using the Group III nitride semiconductor growth substrate 1 having the above-described structure, a Group III nitride semiconductor free-standing substrate and a Group III nitride semiconductor element in accordance with the present invention can be obtained.

Next, an embodiment of a method of producing a Group III nitride semiconductor growth substrate of the present invention will be described with reference to the drawings.

The method of producing the Group III nitride semiconductor growth substrate 1 of the present invention can be produced by, as shown in FIG. 1, a step of forming a single metal layer made of a Sc material on the crystal growth substrate 3 including the surface portion 2 composed of the Group III nitride semiconductor which contains at least Al, and a step of nitriding the metal layer to form the scandium nitride film 4. With such a structure, without greatly reducing the crystallinity of the Group III nitride semiconductor layer to be formed thereover, the crystal growth substrate 3 can be separated from the Group III nitride semiconductor layer by chemical lift-off.

For example, sapphire, Si, SiC, GaN, AlGaN, AlN, or the like can be used for the base substrate 6. In terms of cost of procuring a substrate, sapphire or Si can be preferably used in particular. The metal layer made of a Sc material can be formed by sputtering. Although vapor deposition is possible, sputtering is preferable.

The nitriding of the Sc material can be performed by heating in a mixed gas containing ammonia, and further containing one or two of an inert gas (one or more selected from rare gases such as $N_2$, Ar, He, and Ne) and a hydrogen gas; or in an ammonia gas. Since the Sc material is sublimable, it is preferable to start flowing the synthetic gas or ammonia gas at a temperature lower than the sublimation temperature in the elevated temperature process. Thus, Sc is nitrided to form ScN, which is a material stable under high temperatures. Alternatively, it is permissible to start to flow the synthetic gas or ammonia gas at room temperature; however, it is preferable to start to flow the synthetic gas or ammonia gas at a temperature in the vicinity of 500° C., the decomposition temperature of ammonia, since wasting of the ammonia gas can be prevented, which leads to cost reduction. A highest temperature of the heating temperature (temperature of the surface of base substrate) is preferably 850° C. to 1300° C. When it is lower than 850° C., nitriding cannot be conducted sufficiently in some cases. When it is higher than 1300° C., the high temperature would shorten the equipment life. The heating is performed so that the time where 850° C. or higher is kept is preferably in the range of 1 minute to 120 minutes. When the time is shorter than 1 minute, nitriding may not be performed sufficiently. When the time is longer than 120 minute, it is not particularly effective and is disadvantageous in terms of productivity. The kind of inert gas is not limited in particular, and N, Ar, or the like can be used. A concentration of the ammonia gas is preferably in the range of 0.01 vol % to 100 vol %. When the concentration is less than the lower limit, nitriding may not be performed sufficiently. When the ammonia gas concentration is too high, the surface roughness after the nitriding process may be high. Therefore, the concentration of the ammonia gas is more preferably 0.01 vol % to 90 vol %. Further, the mixed gas may contain hydrogen at 20 vol % or less.

Note that even under the conditions where the nitriding may be insufficient, as long as at least the surface of the Sc material would find becoming ScN which is oriented to have the (111) plane, a Group III nitride semiconductors can be grown.

A step of forming the initial growth layer 5 composed of at least one layer of a buffer layer made of an $Al_xGa_{1-x}N$ material ($1 \leq x \leq 1$) on the scandium nitride film 4 is preferably added. This is for improving the crystallinity of the Group III nitride semiconductor layer to be formed later, and its growth temperature is preferably in the range of 900° C. to 1300° C. Note that the initial growth layer may be formed by a known growth method such as MOCVD, HVPE (hydride vapor phase epitaxy), PLD (pulsed laser deposition).

The Group III nitride semiconductor growth substrate 1 in accordance with the present invention can be produced using the above-described methods.

Figure 2:
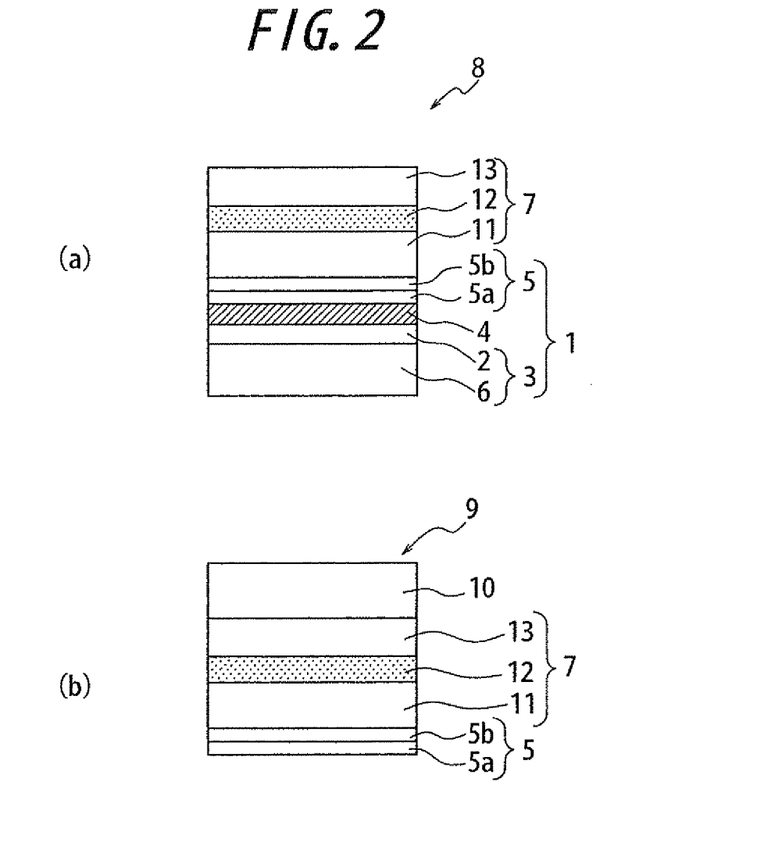
FIG. 2 is a schematic view illustrating a production process of a nitride semiconductor element according to the present invention.

Next, as shown in FIG. 2A, a method of producing a Group III nitride semiconductor epitaxial substrate 8 according to the present invention includes a step of epitaxially growing at least one layer of a Group III nitride semiconductor layer 7 over the Group III nitride semiconductor growth substrate 1 manufactured by the above method. With such a structure, the Group III nitride semiconductor epitaxial substrate having good crystallinity can be produced which can cover the growth temperature range of the whole composition range of the Group III nitride semiconductor material, which exceeds the temperature limit (wavelength limit) of the case of using a CrN material for removing the crystal growth substrate 3 to be described later by chemical lift-off.

The Group III nitride semiconductor layer 7 is preferably grown at the highest temperature range of 900° C. to 1300° C. by MOCVD, HVPE, PLD, MBE, or the like.

It is preferable to additionally form the initial growth layer 5 composed of at least one layer of a buffer layer made of an $Al_xGa_{1-x}N$ material ($0 \leq x \leq 1$) on the scandium nitride film 4. This is for improving the crystallinity of the Group III nitride semiconductor layer 7 to be formed later, and its growth temperature is preferably in the range of 900° C. to 1300° C.

The initial growth layer 5 may be composed of a single layer; however, preferably composed of two or more layers in terms of improving the crystallinity of the Group III nitride semiconductor layer 7 formed later. When the initial growth layer 5 has two layers, it is preferable that the initial growth layer 5 has a first buffer layer 5a and a second buffer layer 5b grown on the first buffer layer 5a; a growth temperature of the first buffer layer 5a is in the range of 900° C. to 1260° C.; a growth temperature of the second buffer layer 5b is in the range of 1000° C. to 1300° C.; and the growth temperature of the first buffer layer 5a is lower than that of the second buffer layer 5b. In an initial growth stage of growing the first buffer layer 5a, the growth is performed at a relatively low temperature so that many initial growth nuclei are promoted to be formed to improve the crystallinity, and the second buffer layer 5b to be grown later is grown at a high temperature. Thus, grooves and cavities formed between many initial nuclei are filled, so that the flatness can be improved as well as the improvement in the crystallinity. Further, the buffer layer may have three or more layers. In that case, the growth temperatures are preferably higher in order. When the initial growth layer 5 has one layer, the growth temperature is preferably in the range of 1000° C. to 1300° C.

The Group III nitride semiconductor epitaxial substrate 8 in accordance with the present invention can be manufactured using the above described method.

Next, as shown in FIG. 2A and FIG. 2B, a method of producing a Group III nitride semiconductor element 9 of the present invention is performed on the Group III nitride semiconductor epitaxial substrate 8 formed by the above method. The method includes a step of isolating the Group III nitride semiconductor layer 7 having at least one layer into a plurality of elements, a step of forming a support substrate 10 on the Group III nitride semiconductor layer 7 side, and a step of selectively etching the scandium nitride film 4 to separate the Group III nitride semiconductor layer 7 (in the case of FIG. 2B, the Group III nitride semiconductor layer 7 and the buffer layer 5) from the crystal growth substrate 3 by chemical lift-off, so that the Group III nitride semiconductor element 9 is obtained. With such a structure, the Group III nitride semiconductor element having good crystallinity can be efficiently produced, which can cover the growth temperature range of the whole composition range of the Group III nitride semiconductor material, which exceeds the temperature limit (wavelength limit) of the case of using a CrN material for removing the crystal growth substrate 3 by chemical lift-off.

The Group III nitride semiconductor layer 7 having at least one layer may be composed of for example, an n-AlGaN layer 11, an AlInGaN-based quantum well active layer 12, and a p-AlGaN layer 13 as shown in FIG. 2A and FIG. 2B. Note that the conductivity types of these Group III nitride semiconductor layers 11, 12, and 13 may be in the opposite order. Further, the support substrate 10 is preferably formed of a heat dissipating material.

The Group III nitride semiconductor element 9 in accordance with the present invention can be produced by the above method.

Next, a method of producing a Group III nitride semiconductor free-standing substrate of the present invention includes a step of epitaxially growing a Group III nitride semiconductor layer having at least one layer over the Group III nitride semiconductor growth substrate manufactured by the above described method, and a step of selectively etching the scandium nitride film 4 to separate the Group III nitride semiconductor layer from the crystal growth substrate by chemical lift-off thereby obtaining the Group III nitride semiconductor free-standing substrate. With such a structure, the Group III nitride semiconductor free-standing substrate having good crystallinity can be efficiently produced, which can cover the growth temperature range of the whole composition range of the Group III nitride semiconductor material, which exceeds the temperature limit (wavelength limit) of the case of using a CrN material for removing the crystal growth substrate 3 by chemical lift-off.

A thickness of the Group III nitride semiconductor layer may be 50 μm or more. This ensures easy handling.

The Group III nitride semiconductor free-standing substrate in accordance with the present invention can be produced using the above method.

Note that the above description was made to show examples of representative embodiments, and the present invention is not limited to those embodiments.

EXAMPLE

Example 1

An AlN single crystal layer (thickness: 1 μm) was grown on sapphire using MOCVD to manufacture an AlN (0001) template substrate as a nitride semiconductor growth substrate. On the obtained AlN template substrate, Sc was deposited to a thickness shown in Table 1 by sputtering, and then the substrate was set in an MOCVD apparatus. A mixed gas of a nitrogen gas and an ammonia gas was flown at a flow rate in Table 1; heating was performed to a temperature (substrate surface temperature) in Table 1 under that atmosphere; and the temperature was kept at a pressure of 200 Torr for 10 minutes. Thus, a nitriding process was performed. After that, cooling was performed for 70 min to room temperature, and the substrate was taken out of the MOCVD apparatus; thus, five kinds of samples of 1-1 to 1-5 were obtained.

TABLE 1

| Sample No. | Metal layer | | nitriding process | | | atmosphere, flow rate | | whole flow rate (SLM) | x-ray diffraction peak ScN(111) | |
|---|---|---|---|---|---|---|---|---|---|---|
| | metal species | thickness (nm) | temperature (deg. C.) | pressure (Torr) | time (min) | $NH_3$ (%) | $N_2$ (%) | | | |
| 1-1 | Sc | 10 | 1200 | 200 | 10 | 30 | 70 | 3.5 | observed | Example |
| 1-2 | | 10 | 1100 | 200 | 10 | 30 | 70 | 3.5 | observed | Example |
| 1-3 | | 10 | 1000 | 200 | 10 | 30 | 70 | 3.5 | observed | Example |
| 1-4 | | 20 | 1200 | 200 | 10 | 30 | 70 | 3.5 | observed | Example |
| 1-5 | | 20 | 830 | 200 | 10 | 30 | 70 | 3.5 | not observed | Comparative Example |

(Evaluation)

Figure 3:
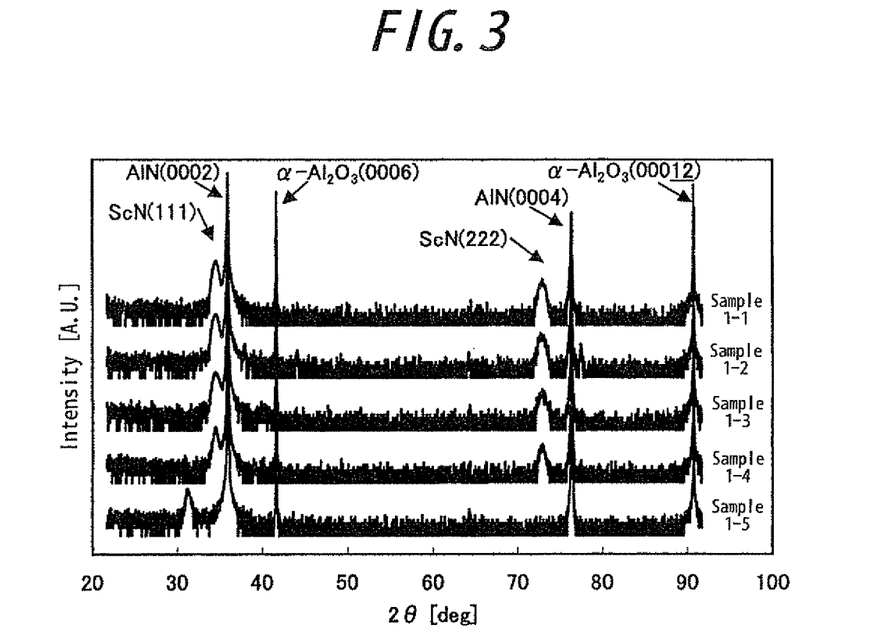
FIG. 3 is a graph illustrating a result of 2θ/ω scan measurement using an x-ray diffractometer.

2θ/ω scan measurement was performed on each of the five samples using an x-ray diffractometer to evaluate the crystallization and crystal orientation of the scandium nitride film. FIG. 3 shows the measurement results. The horizontal axis represents the angle of 2θ while the vertical axis represents the intensity of a diffraction x-ray. With respect to Samples 1-1 to 1-4, in addition to diffraction peaks of sapphire and AlN derived from the AlN template used as a ground substrate, diffraction peaks of (111) and (222) of ScN were observed. This result shows that the Sc film was nitrided to form ScN having a crystal orientation of the (111) plane.

With respect to Sample 1-5 subjected to a nitriding process at a low temperature of 830° C., x-ray diffraction peaks of (111) and (222) of ScN were not observed, and ScN of (111) orientation was not formed.

Figure 4:
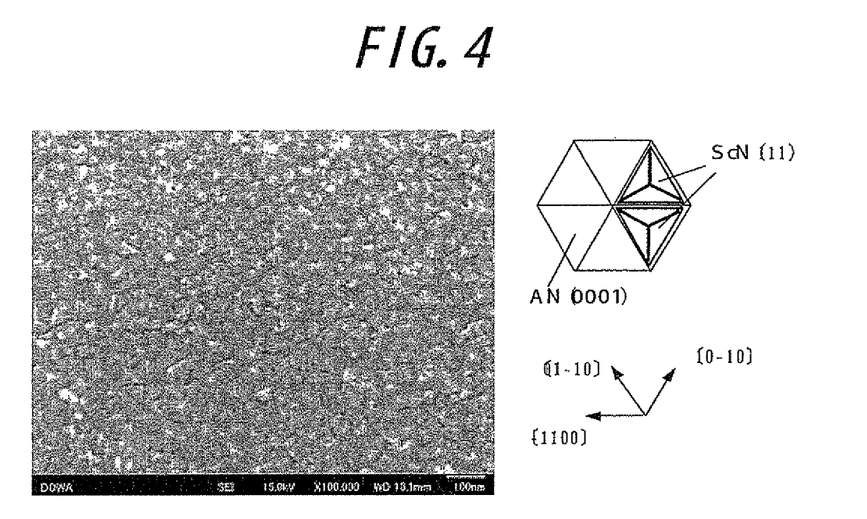
FIG. 4 is a SEM image of a surface of a sample according to the present invention.
Figure 5:
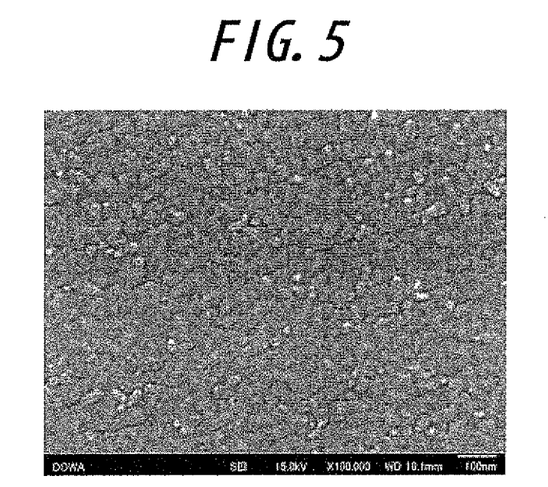
FIG. 5 is a SEM image of a surface of a sample according to the present invention.
Figure 6:
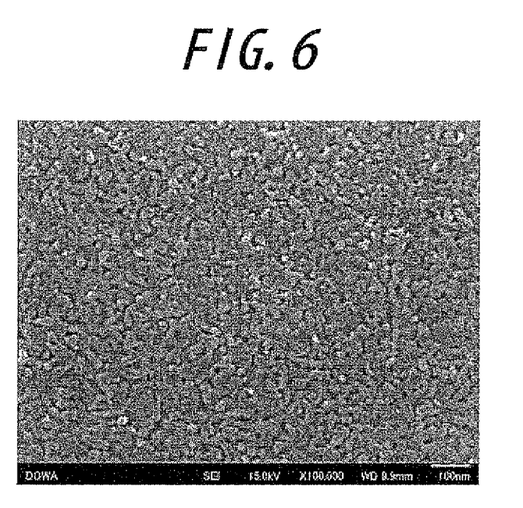
FIG. 6 is a SEM image of a surface of a sample according to the present invention.
Figure 7:
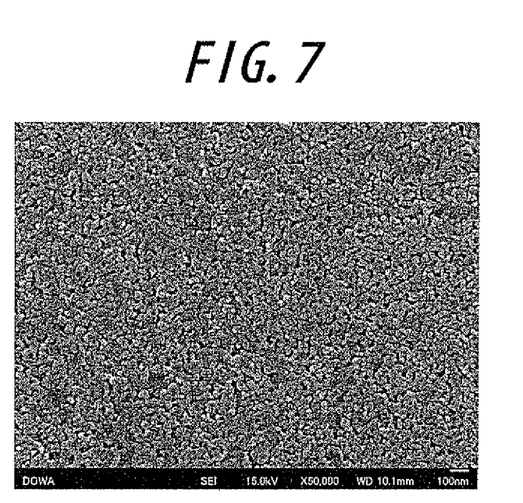
FIG. 7 is a SEM image of a surface of a sample according to the present invention.

Further, FIG. 4 to FIG. 7 show results of observing the surface of each of the samples 1-1 to 1-4 magnified 100,000 times with a scanning electron microscope (SEM). In FIG. 4 in particular, a plurality of protrusions having a triangular pyramid shape existed on the surface of the scandium nitride film, and each of the protrusions was the approximately same in size, and the protrusions were tightly arranged. Such protrusions were distributed uniformly on the entire surface of the ground substrate. The triangular pyramids had two kinds of directions of their bases, and the directions of the bases were along <1-100> directions of the AlN (0001) of the surface of the ground substrate. Further, the surfaces other than the bottom surfaces of the triangular pyramids are composed of approximate {100} planes.

When Samples 1-1 to 1-4 were immersed in etchants below at room temperature, the ScN film of each of the four kinds of samples was observed to be removed by each of the etchants.

Note

<Etchants> hydrofluoric acid (46%), buffered hydrofluoric acid ($NH_4HF_2$:17.1%, $NHF_4$:18.9%), nitric acid (61%), hydrochloric acid (36%), sulfuric acid (96%), mixed acid of sulfuric acid and nitric acid (the sulfuric acid: the nitric acid=9:1), malic acid, citric acid, acidum tartaricum (% means mass %)

As described above, a ScN film of the present invention can be removed using a wide variety of acid solutions and can be selected depending on a support substrate, a electrode, and a bonding material.

Example 2

As is the case with Example 1, a single metal layer of the metal species and thickness shown in Table 2 was formed on an AlN (0001) template substrate by sputtering. Thus formed samples were treated by a nitriding process under the conditions of Table 2 as in Example 1. Note that Sample 2-2 is a comparative example which was not nitrided, and was treated by heat treatment in a hydrogen gas. Following after that, a buffer layer made of an AlN material (1 μm) was further formed by MOCVD under the conditions shown in Table 2 to obtain Samples 2-1 to 2-3. The source gas of Al was TMA.

TABLE 2

| Sample No. | Metal layer | | process conditions | | | atmosphere, flow rate | | | whole flow rate (SLM) | buffer layer | | | |
|---|---|---|---|---|---|---|---|---|---|---|---|---|---|
| | metal species | thickness (nm) | temperature (deg. C.) | pressure (Torr) | time (min) | $NH_3$ (%) | $N_2$ (%) | $H_2$ (%) | | temperature (deg. C.) | pressure (Torr) | V/III ratio | |
| 2-1 | Sc | 10 | 1200 | 200 | 10 | 30 | 70 | — | 3.5 | 1125 | 10 | 120 | Example |
| 2-2 | | 20 | 1200 | 200 | 10 | — | — | 100 | 3.5 | 1125 | 12 | 120 | Comparative Example |
| 2-3 | Cr | 20 | 1200 | 200 | 10 | 10 | 20 | 70 | 3.5 | 1125 | 12 | 120 | Comparative Example |

(Evaluation)

An x-ray rocking curve measurement was performed on the (0002) plane and the (10-12) plane of AlN of the AlN buffer layers of Samples 2-1 to 2-3, and surface evenness of the AlN buffer layers of Samples 2-1 to 2-3 was evaluated using an AFM. The results are shown in Table 3. The full width at half maximum of an x-ray rocking curve of Sample 2-1 in which the metal nitride layer was made of ScN was nearly equivalent to that of Sample 2-3 in which the metal nitride layer was made of CrN as shown in Table 3. Further, the crystallinity of the AlN buffer layer of Sample 2-1 was approximately equivalent to that of Sample 2-3, and was favorable.

A 850 μm □ (square) $SiO_2$ pattern was formed as a mask in each of Samples 2-1 to 2-3, and the AlN buffer layer was etched by dry etching to form a groove portion in which the metal nitride layer was exposed. After that, a bonding layer containing Au was formed on the AlN buffer layer and was bonded to a support substrate. A material of the support substrate was selected, which is tolerant to an aqueous solution used in etching. The combinations of the support substrate and the etchant are as shown in Conditions 1 to 4 below.

Note

Condition 1 aqueous solution containing hydrofluoric acid: HF (46 mass %)
(support substrate: Mo, bonding layer: Au—Sn)
Condition 2 aqueous solution containing nitric acid: $HNO_3$ (61 mass %)
(support substrate: Si, bonding layer: Au—Au)
Condition 3 aqueous solution containing hydrochloric acid: HCl (36 mass %)
(support substrate: Si, bonding layer: Au—Au)
Condition 4 aqueous solution containing Cr etchant: $(NH_4)_2Ce(NO_3)_6$ (14 mass %) and $HNO_3$ (3 mass %)
(support substrate: Si, bonding layer: Au—Au)

Under these Conditions 1 to 4, the temperature of each of the aqueous solutions was set at 25° C., and Samples 2-1 to 2-3 were immersed for 24 hours.

Table 4 shows the results. In Table 4, a circle mark (○) represents the case when the AlN buffer layer and the growth substrate was separated, and a cross mark (×) represents the case when they could not be separated. In Sample 2-1, lift-off is possible under all the conditions. In Sample 2-2, sublimation of metallic Sc eliminated the metal layer which was a layer to be etched, and the AlN buffer layer was formed directly on the AlN template. Therefore, lift-off is considered to have been impossible. In Sample 2-3, CrN melted under a high temperature, and was rendered unable to cover the entire surface, so that the AlN buffer layer was partially formed directly on the AlN template. Therefore, lift-off is considered to have been impossible.

TABLE 3

| Sample No. | metal species | XRC for AlN (0002) [arcsec] | (10-12) [arcsec] | AFM Ra [Å] | |
|---|---|---|---|---|---|
| 2-1 | Sc | 85 | 1611 | 165 | Example |
| 2-2 | | 75 | 1420 | 2.3 | Comparative Example |
| 2-3 | Cr | 52 | 1505 | 2.0 | Comparative Example |

TABLE 4

| Sample No. | Condition 1 | Condition 2 | Condition 3 | Condition 4 |
|---|---|---|---|---|
| 2-1 | ○ | ○ | ○ | ○ |
| 2-2 | X | X | X | X |
| 2-3 | X | X | X | X |

Example 3

As is the case with Example 1, a Sc metal layer was formed to a thickness shown in Table 5 on an AlN (0001) template substrate by sputtering, and thereafter a nitriding process was performed under the conditions shown in Table 5. With respect to thus formed samples, one or two layers of buffer layers made of an AlN material were formed under the conditions shown in Table 5 to obtain Samples 3-1 and 3-2. Note that film formation conditions other than the conditions shown in Table 5 were the same as those in the case of Example 2.

TABLE 5

| Sample No. | metal species | thickness (nm) | nitriding process temperature (deg. C.) | pressure (Torr) | time (min) | buffer layers first buffer layer temperature (deg. C.) | pressure (Torr) | time (min) | heating time (min) | second buffer layer temperature (deg. C.) | time (min) | |
|---|---|---|---|---|---|---|---|---|---|---|---|---|
| 3-1 | Sc | 10 | 1200 | 200 | 10 | 1040 | 10 | 1 | 5 | 1170 | 49 | Example |
| 3-2 | | 10 | 1200 | 200 | 10 | 1170 | 10 | 50 | | | | Example |

(Evaluation)

Figure 8:
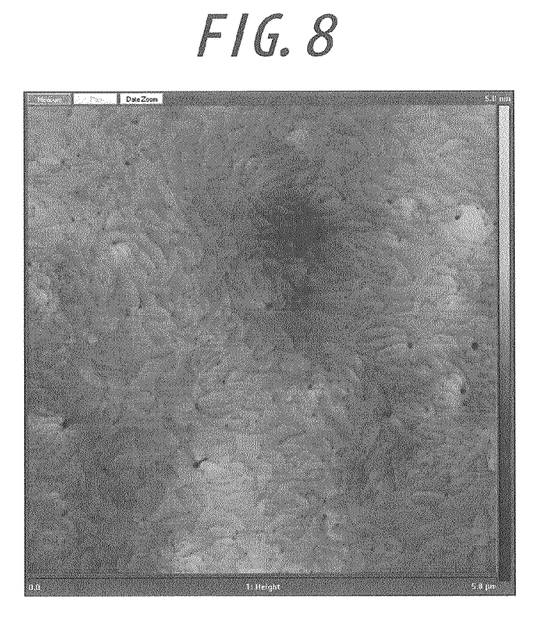
FIG. 8 is an surface height image of a sample according to the present invention obtained using an AFM (atomic force microscope)

FIG. 8 shows a sample surface image of Sample 3-1, obtained by AFM. Atomic steps was observed, which shows that an AlN layer which was flat at the atomic level was obtained. On the other hand, with respect to Sample 3-2, great unevenness was caused by surface roughness and measurement with the AFM was difficult.

The result of evaluating an x-ray rocking curve of the AlN buffer layer in Samples 3-1 and 3-2 with the same method as the cases of Samples 2-1 to 2-3, and the results of measuring Ra of the AlN buffer layer with the AFM are shown in Table 6. In Sample 3-1, in which the AlN buffer layer had two layers on the metal layer, Ra was greatly improved compared with Sample 3-2, in which the AlN buffer layer had one layer. If the AlN buffer layer has two layers, the surface evenness of the AlN buffer layer can be improved.

TABLE 6

| Sample No. | metal species | XRC for AlN (0002) [arcsec] | (10-12) [arcsec] | AFM Ra [Å] | |
|---|---|---|---|---|---|
| 3-1 | Sc | 109 | 1649 | 2.2 | Example |
| 3-2 | | 181 | 1454 | >100.9 | Example |

Example 4

As is the case with Example 1, a 15 nm-thick Sc metal layer was formed on an AlN (0001) template substrate having a diameter of two inches by sputtering, and thereafter a nitriding process was performed in an MOCVD apparatus at a pressure of 200 Torr and a substrate temperature of 1150° C. for 10 minutes. Here, the mixing ratio between $NH_3$ and $N_2$ was 30:70 each in volume percentage.

After the nitriding process, the substrate temperature was lowered to 1020° C., and AlN as a first buffer layer was grown to 80 nm on the scandium nitride film under the condition of a pressure of 10 Torr. After that, the substrate temperature was raised to 1200° C. and an AlN layer was grown to 920 nm as a second buffer layer. The ratio of V/III at the time of AlN growth was 120, and the growth rate was about 1000 nm/hr.

Subsequently, a 2.5 μm thick n-type AlGaN cladding layer, a MQW (multiple quantum well) light emitting layer of AlInGaN/AlGaN, a p-type AlGaN electron blocking layer, a p-type AlGaN cladding layer, and a p-type AlGaN contact layer (total thickness of the p-type layers was 25 μm) were grown in an MOCVD furnace to obtain an epitaxial substrate having an UV-LED structure.

Epitaxial layers of this epitaxial substrate were grooved with a grid pattern by dry etching to the AlN template portion to perform primary isolation into individual LED chips. Next, a Rh-based ohmic electrode was formed on the p-type contact layer and then bonded with a low resistivity p-type silicon substrate by vacuum hot press with an AuSu-based bonding layer interposed therebetween. The scandium nitride film was selectively dissolved using hydrochloric acid by using the grooved portion as an etching channel, and consequently, the epitaxial portion having the LED structure was separated from the growth substrate and transferred to the Si support substrate side. Note that an ohmic electrode to be a positive electrode was formed on the backside of the Si substrate.

Figure 9:
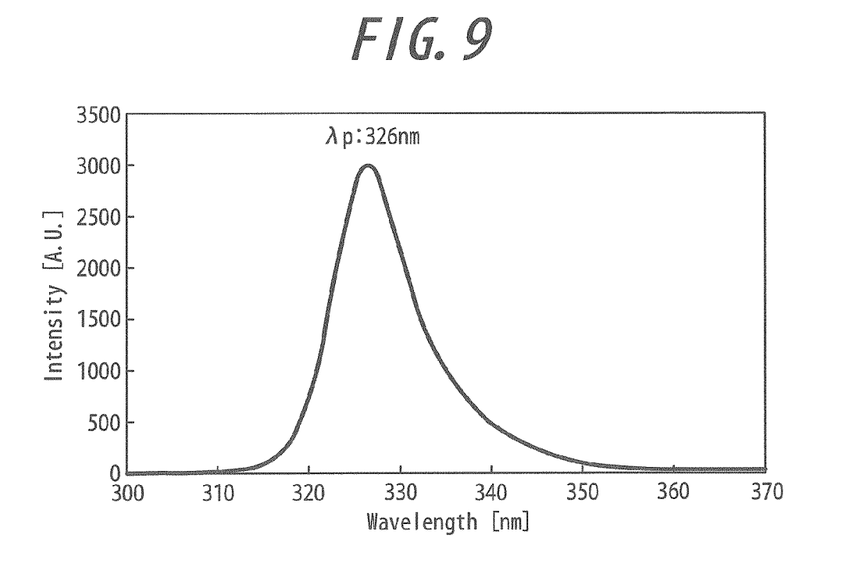
FIG. 9 is a graph illustrating light emission spectrum of a sample according to the present invention.

At least a part of the AlN layer was removed by dry etching and a Ti/Al-based ohmic electrode was formed on the part of the n-type AlGaN cladding layer exposed by etching. Dicing was performed along the primary isolation groove with a blade dicer to obtain individual pieces of LED chips. Characteristic of the obtained UV LED having a vertical structure was evaluated and the LED exhibited an emission spectrum with a peak wavelength of 326 nm as shown in FIG. 9. Further, light power output was 2.5 mW with a forward drive current $I_f$ of 20 mA, which was a very favorable result for this wavelength range. Note that when Cr was used as a metal layer on the AlN template substrate, the substrate experienced a temperature of 1200° C. before epitaxial growth for the UV-LED structure, and the subsequent process steps could not be performed, and LEDs of such a wavelength was not obtained.

Example 5

As is the case with Example 1, a 15 nm-thick Sc metal layer was formed on an AlN (0001) template substrate having a diameter of two inches by sputtering, and thereafter a nitriding process was performed in an MOCVD apparatus at a pressure of 200 Torr and a substrate temperature of 1150° C. for 10 minutes. Here, the mixing ratio between $NH_3$ and $N_2$ was 30:70 each in volume percentage.

After the nitriding process, the substrate temperature was lowered to 1020° C., and AlN as a first buffer layer was grown to 80 nm on the scandium nitride film under the condition of a pressure of 10 Torr. After that, the substrate temperature was raised to 1200° C. and an AlN layer was grown to 920 nm as a second buffer layer. The ratio of V/III at the time of AlN growth was 120, and the growth rate was about 1000 nm/hr. The source gas of Al was TMA.

After then raising the substrate temperature to 1250° C., the feed rate of TMA was doubled while keeping the V/III ratio to grow an AlN layer with a thickness of 100 μm for 48 hours. After cooling and taking out, the substrate was immersed in hydrochloric acid to selectively etch the scandium nitride film and separate the AlN template substrate for growth to obtain, an AlN single crystal free-standing substrate having a diameter of two inches.

Example 6

As is the case with Example 1, a 20 nm-thick Sc metal layer was formed on an AlN (0001) template substrate having a diameter of two inches by sputtering, and then a nitriding process was performed in an MOCVD apparatus at a pressure of 200 Torr and a substrate temperature of 1200° C. for 10 minutes.

After the nitriding process, the substrate temperature was lowered to 900° C. to perform initial growth of a GaN layer for 10 minutes, and then thick film growth (thickness of approximately 7 μm) of GaN was performed at a substrate temperature of 1040° C. for two hours. After cooling and taking out, the sample was set in an HVPE furnace and the substrate temperature was raised to 1040° C. at a heating rate of 20° C./min. Note that concurrently with the heating of the substrate, the temperature of Ga material source portion was heated to 850° C. Note further that the flow rate of the ambient gas was as follows: $N_2$-300 sccm, $H_2$-100 sccm, and $NH_3$-1000 sccm from the point of 600° C. during the rise in temperature of the samples. The substrate temperature was kept at 1040° C. for about five minutes for the system temperature being stable, and supply of HCl to the Ga source portion was started at a flow rate of 40 sccm to start to grow GaN. Two hours later, the supply of HCl was stopped to terminate the growth, and cooling was performed at a cooling rate of 25° C./min. At the time point where the substrate temperature became 600° C., the supply of $NH_3$ gas was stopped. The samples were cooled, taken out, and immersed in hydrochloric acid, so that the scandium nitride film was selectively etched to separate the AlN template substrate for growth to obtain a GaN single crystal free-standing substrate having a diameter of two inches and a thickness of 163 μm.

Thus, the present invention has been explained in details giving specific examples in embodiments and examples. However, the present invention is not limited to the above embodiments and examples of the invention, and can be modified or varied without departing from the scope the present invention.

INDUSTRIAL APPLICABILITY

A Group III nitride semiconductor growth substrate of the present invention comprises a crystal growth substrate including a surface portion composed of a Group III nitride semiconductor which contains at least Al, and a scandium nitride film formed on the surface portion. Thus, without greatly reducing the crystallinity of a Group III nitride semiconductor layer $Al_xGa_yIn_{1-x-y}N$ ($0 \leq x \leq 1$, $0 \leq y \leq 1$, $0 \leq x+y \leq 1$) to be formed later, the Group III nitride semiconductor layer can be easily separated from the crystal growth substrate by chemical lift-off.

Further, in chemical lift-off, an acid solution is used as an etchant, which allows the Group III nitride semiconductor layer to be easily separated from the crystal growth substrate. As the etchant, a hydrochloric acid aqueous solution, a nitric acid aqueous solution, a mixed acid of sulfuric acid and nitric acid, organic acid, or the like can be used, and an acid solution which dissolves only ScN without dissolving the materials of the support substrate or the electrode to be used is appropriately selected.

Furthermore, according to the present invention, the above Group III nitride semiconductor growth substrate is used, which allows the substrate to be removed by chemical lift-off.

Besides, a Group III nitride semiconductor epitaxial substrate, a Group III nitride semiconductor element, and a Group III nitride semiconductor free-standing substrate, which have good crystallinity can be provided, which can cover all wavelengths (200 nm to 1.5 μm) covered by a Group III nitride semiconductor material which exceeds the wavelength limit of the case of using a CrN material, in other words, which can cover the growth temperature range of the whole composition range of $Al_xGa_yIn_{1-x-y}N$ ($0 \leq x \leq 1$, $0 \leq y \leq 1$, $0 \leq x+y \leq 1$) including from AlN grown at a high temperature of 1200° C. or more to InN grown at a temperature of about 500° C.

Moreover, according to the present invention, a step of forming a metal layer made of a Sc material on a crystal growth substrate a surface portion composed of a Group III nitride semiconductor which contains at least Al, and a step of performing a nitriding process to the metal layer are provided. Thus, a Group III nitride semiconductor growth substrate can be produced such that the Group III nitride semiconductor layer can be easily separated from the crystal growth substrate by chemical lift-off without greatly reducing the crystallinity of the Group III nitride semiconductor layer $Al_xGa_yIn_{1-x-y}N$ ($0 \leq x \leq 1$, $0 \leq y \leq 1$, $0 \leq x+y \leq 1$) to be formed later.

In addition, in accordance with the present invention, chemical lift-off is performed using the above Group III nitride semiconductor growth substrate. Thus, a Group III nitride semiconductor epitaxial substrate, a Group III nitride semiconductor element, and a Group III nitride semiconductor free-standing substrate, which have good crystallinity can be produced efficiently, which can cover all wavelengths (200 nm to 1.5 μm) covered by a Group III nitride semiconductor material which exceeds the wavelength limit of the case of using a CrN material.

DESCRIPTION OF REFERENCE NUMERALS

1 Group III nitride semiconductor growth substrate
2 surface portion
3 crystal growth substrate
4 scandium nitride film
5 initial growth layer
5a first buffer layer
5b second buffer layer
6 base substrate
7 Group III nitride semiconductor layer
8 Group III nitride semiconductor epitaxial substrate
9 Group III nitride semiconductor element
10 support substrate
11 n-AlGaN layer
12 AlInGaN-based quantum well active layer
13 p-AlGaN layer

The invention claimed is:

1. A Group III nitride semiconductor growth substrate comprising:
a crystal growth substrate including a surface portion composed of $Al_xGa_{1-x}N$ ($0.5 \leq x \leq 1$), a surface of the surface portion having a crystal orientation of the {0001} plane,
a scandium nitride film formed on the surface of the surface portion, and having a crystal orientation of the {111} plane, and
an initial growth layer formed on the scandium nitride film, at least having a first buffer layer made of $Al_yGa_{1-y}N$ ($0 \leq y \leq 1$) directly on the scandium nitride film and a second buffer layer made of $Al_zGa_{1-z}N$ ($0 \leq z \leq 1$) directly on the first buffer layer, wherein the first buffer layer is formed at a growth temperature in a range of 900° C. to 1260° C. and the second buffer layer is formed at a growth temperature in a range of 1030° C. to 1300° C., and wherein the growth temperature of the first buffer layer is lower than the growth temperature of the second buffer layer,
wherein the first buffer layer is composed of AlN and the second buffer layer is composed of AlN.

2. The Group III nitride semiconductor growth substrate according to claim 1, wherein a thickness of the scandium nitride film is 3 nm to 100 nm.

3. The Group III nitride semiconductor growth substrate according to claim 1, wherein a base substrate of the crystal growth substrate is selected from the group consisting of sapphire, Si, SiC, and GaN.

4. The Group III nitride semiconductor growth substrate according to claim 1, wherein x is 1 such that the surface portion is composed of AlN.

5. The Group III nitride semiconductor growth substrate according to claim 1, wherein the scandium nitride film has a plurality of microcrystal portions having a triangular pyramid shape, and the plurality of microcrystal portions are uniformly formed on the surface portion.

6. A Group III nitride semiconductor epitaxial substrate comprising at least one layer of a Group III nitride semiconductor layer on the Group III nitride semiconductor growth substrate according to claim 1.

7. A Group III nitride semiconductor free-standing substrate produced using the Group III nitride semiconductor growth substrate according to claim 1.

8. A Group III nitride semiconductor element produced using the Group III nitride semiconductor growth substrate according to claim 1.

* * * * *